(12) United States Patent
Kasai et al.

(10) Patent No.: US 11,385,280 B2
(45) Date of Patent: Jul. 12, 2022

(54) INSPECTION APPARATUS AND TEMPERATURE CONTROL METHOD

(71) Applicant: TOKYO ELECTRON LIMITED, Tokyo (JP)

(72) Inventors: Shigeru Kasai, Nirasaki (JP); Yoshinori Fujisawa, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 56 days.

(21) Appl. No.: 17/056,524

(22) PCT Filed: May 9, 2019

(86) PCT No.: PCT/JP2019/018537
§ 371 (c)(1),
(2) Date: Nov. 18, 2020

(87) PCT Pub. No.: WO2019/225332
PCT Pub. Date: Nov. 28, 2019

(65) Prior Publication Data
US 2021/0208194 A1 Jul. 8, 2021

(30) Foreign Application Priority Data
May 23, 2018 (JP) .............................. JP2018-098705

(51) Int. Cl.
*G01R 31/28* (2006.01)
(52) U.S. Cl.
CPC ..... *G01R 31/2874* (2013.01); *G01R 31/2862* (2013.01); *G01R 31/2879* (2013.01)

(58) Field of Classification Search
CPC ............ G01R 31/2874; G01R 31/2642; G01R 31/2865; G01R 31/2875; G01R 31/2877;
(Continued)

(56) References Cited

U.S. PATENT DOCUMENTS

| 5,715,051 A | * | 2/1998 | Luster ................ G01B 11/0625 356/237.2 |
| 11,169,204 B2 | * | 11/2021 | Kobayashi ........ H01L 21/67248 |

(Continued)

FOREIGN PATENT DOCUMENTS

JP H10-135315 A 5/1998

*Primary Examiner* — Vinh P Nguyen
(74) *Attorney, Agent, or Firm* — Nath, Goldberg & Meyer; Jerald L. Meyer; Tanya E. Harkins (57) ABSTRACT

An apparatus for inspecting an electronic device, includes: a placement table on which a substrate having the electronic device provided thereon is placed and including a refrigerant flow path; a light irradiation mechanism having LEDs directed to the substrate; and a controller for controlling heat absorption by the refrigerant and heating by light from the LEDs. The controller includes: a temperature information acquisition part for acquiring information on a temperature of the electronic device; a heating controller for performing the heating control based on the temperature of the electronic device as a current inspection object; and a heat absorption controller for estimating a transition of power applied to the electronic device at a next inspection based on a transition of the temperature of the electronic device in a past inspection, and performing the heat absorption control at a time of the next inspection.

5 Claims, 6 Drawing Sheets

(58) Field of Classification Search
CPC ............ G01R 31/2601; G01R 31/2635; G01R 31/2831; G01R 31/2891; G01R 31/26; G01R 31/2856; G01R 31/2862; G01R 31/2619; G01R 31/2863; G01R 1/073; G01R 31/311; G01R 1/0408; G01R 1/07307; G01R 31/2637; G01R 31/2808; G01R 31/2829; G01R 31/2849; G01R 31/2837; G01R 1/06711; G01R 31/28; G01R 31/56; G01R 31/2886; G01N 23/225; G01N 23/2251; G01N 21/9501; G01N 23/223; G01N 2021/6484; G01N 21/31; G01N 21/956; G01N 21/958; G02B 5/201; G02F 1/0147; G01K 1/026; G01K 15/007; G01K 17/06; G01K 11/00; F28D 15/00; H01L 21/67248; H01L 21/324; H01L 21/67115; H01L 21/268; H01L 2224/49107; H01L 22/00; H01L 21/67005; H01L 21/681; H01L 21/68; H01L 22/30; H01L 2924/12041; H01L 31/09; H01L 31/0224; H05B 45/56; H05B 45/18

See application file for complete search history.

(56) References Cited

U.S. PATENT DOCUMENTS

| | | | |
|---|---|---|---|
| 11,221,358 B2* | 1/2022 | Kasai | G01R 31/2874 |
| 2010/0038833 A1 | 2/2010 | Kasai et al. | |
| 2012/0328273 A1* | 12/2012 | Kawano | H05B 3/0033 |
| | | | 392/418 |
| 2015/0075748 A1 | 3/2015 | Suzuki et al. | |
| 2017/0032983 A1* | 2/2017 | Muta | H01L 21/67109 |

* cited by examiner

FIG. 7

INSPECTION APPARATUS AND TEMPERATURE CONTROL METHOD

CROSS-REFERENCE TO RELATED APPLICATION

This is a National Phase Application filed under 35 U.S.C. 371 as a national stage of PCT/JP2019/018537, filed May 9, 2019, an application claiming the benefit of Japanese Application No. 2018-098705, filed May 23, 2018, the content of each of which is hereby incorporated by reference in its entirety.

TECHNICAL FIELD

The present disclosure relates to an inspection apparatus and a temperature control method.

BACKGROUND

Patent Document 1 discloses an inspection apparatus that performs electrical inspection of a semiconductor wafer on which an IC chip is formed under various temperature conditions in consideration of climatic conditions in which the IC chip is used. The inspection apparatus disclosed in Patent Document 1 includes a placement table on which the semiconductor wafer is placed, and a heater that heats the placement table. A gas flow path to which low-temperature air that cools the placement table is supplied is formed in the placement table.

PRIOR ART DOCUMENTS

Patent Document

Patent Document 1: Japanese laid-open publication No. 10-135315

The technique according to the present disclosure provides some embodiments of an inspection apparatus for an electronic device, and a temperature control method in the inspection apparatus, which are capable of suppressing an increase in cost of the electronic device.

SUMMARY

An aspect of the present disclosure is an electronic device, comprising: a placement table on which a substrate having the electronic device provided thereon is placed, wherein a side of the placement table opposite to a substrate placement side of the placement table is formed of a light-transmissive member, and the placement table has a refrigerant flow path provided therein and through which a refrigerant capable of transmitting light flows; a light irradiation mechanism disposed so as to face a surface of the side of the placement table opposite to the substrate placement side of the placement table and having a plurality of LEDs directed to the substrate; and a controller configured to control heat absorption by the refrigerant flowing through the refrigerant flow path and heating by the light from the plurality of LEDs so as to control a temperature of the electronic device as an inspection object, wherein the controller includes: a temperature information acquisition part configured to acquire information on the temperature of the electronic device as the inspection object; a heating controller configured to perform the control of the heating of the electronic device as the inspection object by the light from the plurality of LEDs by a closed loop control based on the temperature of the electronic device as a current inspection object; and a heat absorption controller configured to estimate a transition of power applied to the electronic device at a next inspection based on a transition of the temperature of the electronic device in a past inspection, and perform the control of the heat absorption from the electronic device as the inspection object by the refrigerant at a time of the next inspection by an open loop control based on the estimated transition of the power.

According to the present disclosure, it is possible to provide an inspection apparatus for an electronic device, and a temperature control method in the inspection apparatus, which are capable of suppressing an increase in cost of the electronic device.

DETAILED DESCRIPTION

First, a conventional inspection apparatus disclosed in Patent Document 1 will be described. In a semiconductor manufacturing process, a large number of electronic devices having a predetermined circuit pattern are formed on a semiconductor wafer (hereinafter sometimes referred to as a "wafer"). The formed electronic devices are subjected to an electrical characteristic inspection or the like to be sorted into good-quality products and defective products. The inspection of the electronic devices is performed by using an inspection apparatus, for example, in a state of the wafer before the electronic devices are divided. As described above, the inspection apparatus disclosed in Patent Document 1 includes a placement table on which a semiconductor wafer is mounted, and a heater that heats the placement table, and a gas flow path to which low-temperature air that cools the placement table is supplied is formed in the placement table.

In recent years, as the high-speed and miniaturization of electronic devices progresses, the degree of integration becomes higher, and the amount of heat generated during operation has greatly increased. Therefore, during the inspection of one electronic device on the wafer, a thermal load is applied to other electronic devices adjacent to the one electronic device, which may cause a malfunction in the other electronic devices.

As a method of avoiding this problem, it is conceivable to a method of controlling the temperature of an electronic device during inspection with low-temperature air or a heater as in the inspection apparatus disclosed in Patent Document 1 to suppress a thermal load to be applied to other electronic devices. However, when the heater or the low-temperature air is used, the temperature of the wafer can be entirely controlled, but it is impossible to suppress the thermal load to be applied to the other electronic devices by controlling the temperature of the wafer locally, for example, only in the vicinity of the electronic device during inspection. This is because it is difficult to miniaturize a gas flow path to which the low-temperature air is supplied and the heater, and thus it is difficult to locally dispose the gas flow path and the heater on the placement table.

Therefore, for example, by setting a voltage to be applied to the electronic device during inspection to be smaller than a relatively high mounting voltage to be applied in the mounting environment, it is possible to avoid the application of a thermal load to other adjacent electronic devices. However, as a result, it is not possible to detect a detect that occurs at the time of applying the mounting voltage before packaging of the electronic device, resulting in a problem that the yield after the packaging is reduced and the cost is increased.

Hereinafter, an inspection apparatus and a temperature control method in the inspection apparatus for suppressing an increase in cost of an electronic device according to an embodiment will be described with reference to the drawings. Throughout the present specification and the drawings, elements having substantially the same functional configuration will be denoted by the same reference numerals, and therefore, explanation thereof will not be repeated.

Figure 1:
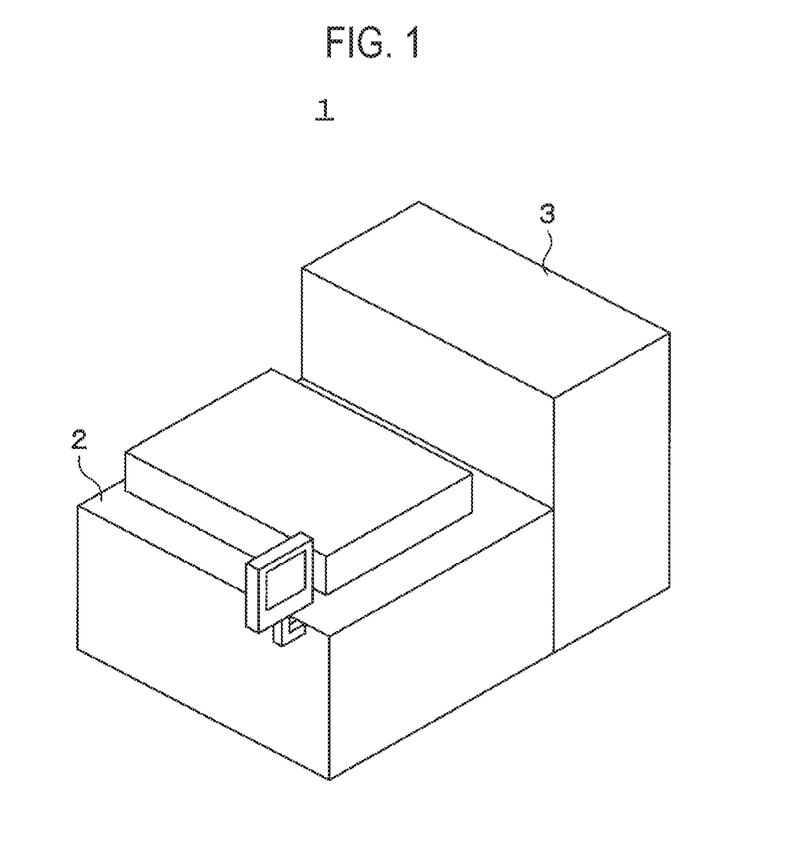
FIG. 1 is a perspective view illustrating a schematic configuration of an inspection apparatus according to an embodiment.
Figure 2:
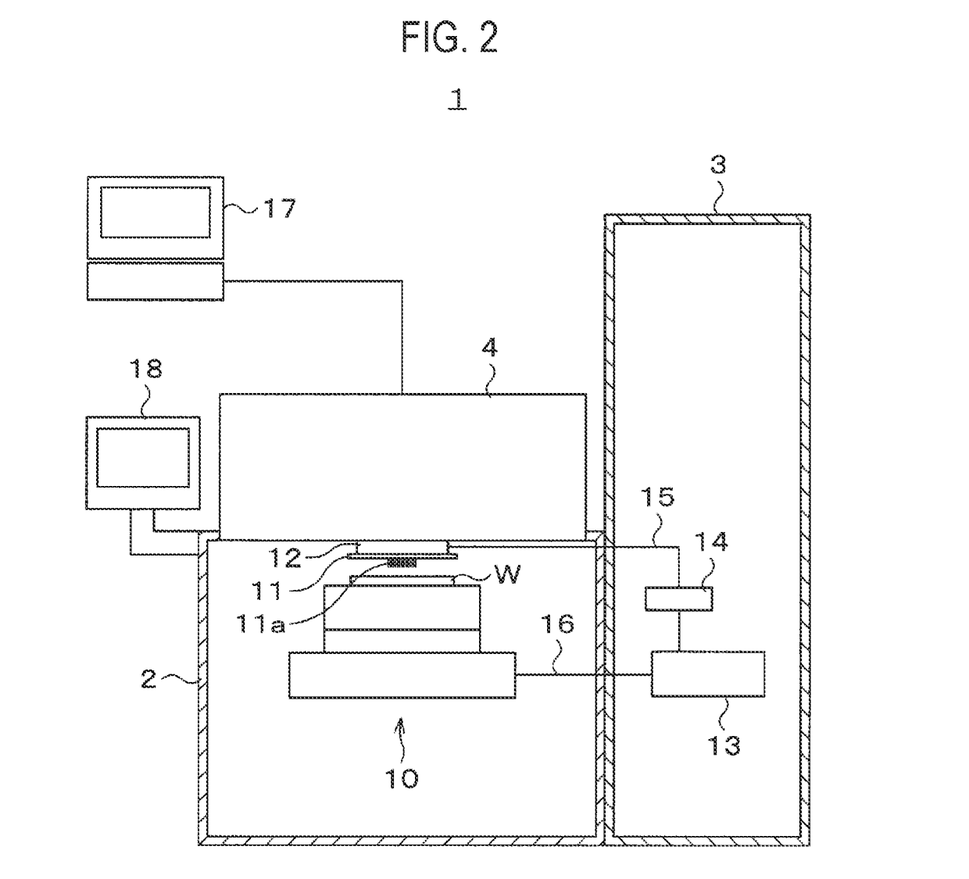
FIG. 2 is a front view illustrating the schematic configuration of the inspection apparatus according to the embodiment.

First, the configuration of the inspection apparatus according to the present embodiment will be described. FIGS. 1 and 2 are a perspective view and a front view, respectively, illustrating an outline of the configuration of the inspection apparatus 1 according to the present embodiment. In FIG. 2, in order to show elements included in an accommodation chamber and a loader, which will be described later, of the inspection apparatus 1 of FIG. 1, a portion thereof is shown in cross section.

The inspection apparatus 1 inspects the electric characteristics of each of a plurality of electronic devices (see reference numeral D in FIG. 3 to be described later) formed on a substrate W. As illustrated in FIGS. 1 and 2, the inspection apparatus 1 includes an accommodation chamber 2 for storing the wafer at the time of inspection, a loader 3 disposed adjacent to the accommodation chamber 2, and a tester 4 disposed to cover an upper portion of the accommodation chamber.

The accommodation chamber 2 is a housing having an internal hollow, and has a stage 10 on which the substrate W to be inspected is placed. The stage 10 holds the substrate W by suction so that the position of the substrate W with respect to the stage 10 is not deviated. Further, the stage 10 is configured to be movable in the horizontal direction and the vertical direction. With this configuration, the relative position between a probe card 11 to be described later and the substrate W is adjusted so that an electrode on the surface of the substrate W can be brought into contact with probes 11a of the probe card 11.

The probe card 11 is disposed above the stage 10 inside the accommodation chamber 2 so as to face the stage 10. The probe card 11 has the probes 11a as contact terminals that are in electrical contact with electrodes or the like of electronic devices installed on the substrate W.

In addition, the probe card 11 is connected to the tester 4 via an interface 12. When each probe 11a contacts the electrode of each of the electronic devices on the substrate W, each probe 11a supplies electric power from the tester 4 to the electronic device via the interface 12, or transmits a signal from the electronic device to the tester 4 via the interface 12.

The loader 3 takes out the substrate W accommodated in an FOUP (not shown), which is a transfer container, and transfers the same to the stage 10 inside the accommodation chamber 2. In addition, the loader 3 receives, from the stage 10, the substrate W for which the electrical characteristics of the electronic device D have been inspected, and stores the same in the FOUP.

Further, the loader 3 has a controller 13 that performs various controls such as temperature control of the electronic device to be inspected, and a potential difference measurement unit 14 that measures a potential difference in a potential difference generation circuit (not shown) of each electronic device. The potential difference generation circuit is, for example, a diode, a transistor, or a resistor. The potential difference measurement unit 14 is connected to the interface 12 via a wiring 15 and acquires a potential difference between two probes 11a in contact with two electrodes corresponding to the potential difference generation circuit. The potential difference measurement unit 14 transmits information on the acquired potential difference to the controller 13. A connection structure of each probe 11a and the wiring 15 in the interface 12 will be described later. The controller 13, which is also referred to as a base unit, is connected to the stage 10 via a wiring 16 and controls a flow control valve that adjusts a flow rate of a refrigerant to be supplied to a light irradiation mechanism 40 (to be described later) and the placement table 30 (to be described later) based on the potential difference information. The controller 13 and the potential difference measurement unit 14 may be provided inside the accommodation chamber 2, and the potential difference measurement unit 14 may be provided in the probe card 11.

The tester 4 has a test board (not shown) that reproduces a portion of a circuit configuration of a motherboard on which the electronic devices are mounted. The test board is connected to a tester computer 17 which determines a quality of the electronic device based on a signal from the respective electronic device. In the tester 4, circuit configurations of a plurality of types of motherboards can be reproduced by replacing the test board.

Further, the inspection apparatus 1 includes a user interface 18 for displaying information to a user and for inputting an instruction from the user. The user interface 18 includes, for example, an input part such as a touch panel, a keyboard, or the like, and a display part such as a liquid crystal display or the like.

In the inspection apparatus 1 having the above-mentioned components, the tester computer 17 transmits data to the test board connected to the electronic device via each probe 11a when inspecting the electrical characteristics of the electronic device. Then, the tester computer 17 determines whether or not the transmitted data has been correctly processed by the test board, based on an electric signal from the test board.

Figure 3:
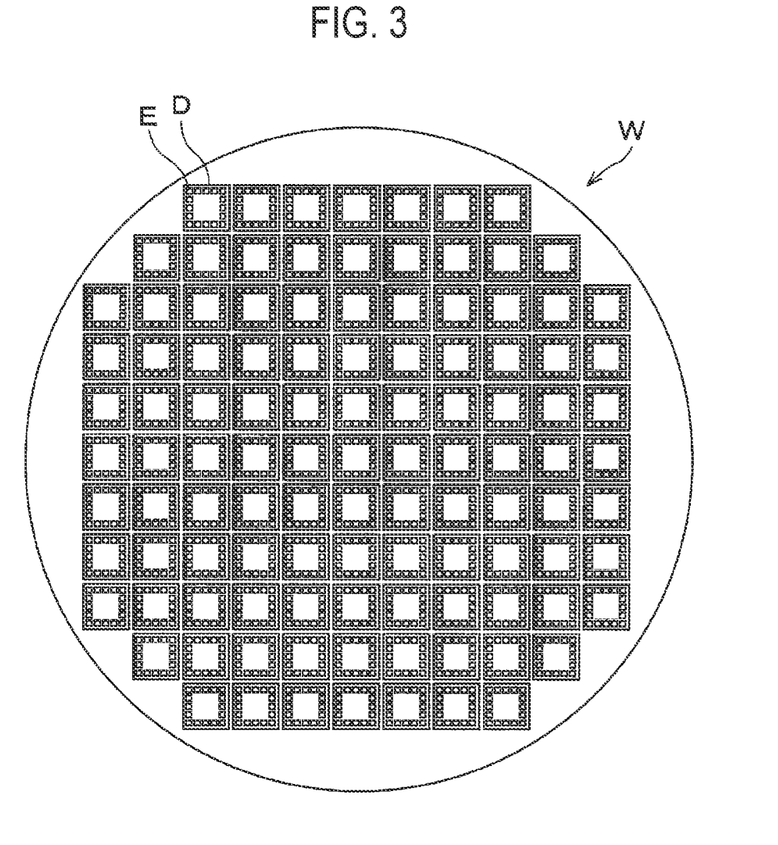
FIG. 3 is a plan view schematically illustrating a configuration of a substrate.

Next, the substrate W, which is an object to be inspected of the inspection apparatus 1 described above, will be described with reference to FIG. 3. FIG. 3 is a plan view schematically illustrating the configuration of the substrate W.

By performing an etching process or a wiring process on a wafer such as substantially a disk-shaped silicon substrate, the plurality of electronic devices D is formed the surface of the substrate W at predetermined intervals as illustrated in FIG. 3. Electrodes F are formed on the electronic devices D, that is, on the surface of the substrate W. The electrodes F are electrically connected to circuit elements inside the electronic devices D, respectively. By applying a voltage to the electrodes E, a current can be flowed to the circuit elements inside the electronic devices D.

Figure 4:
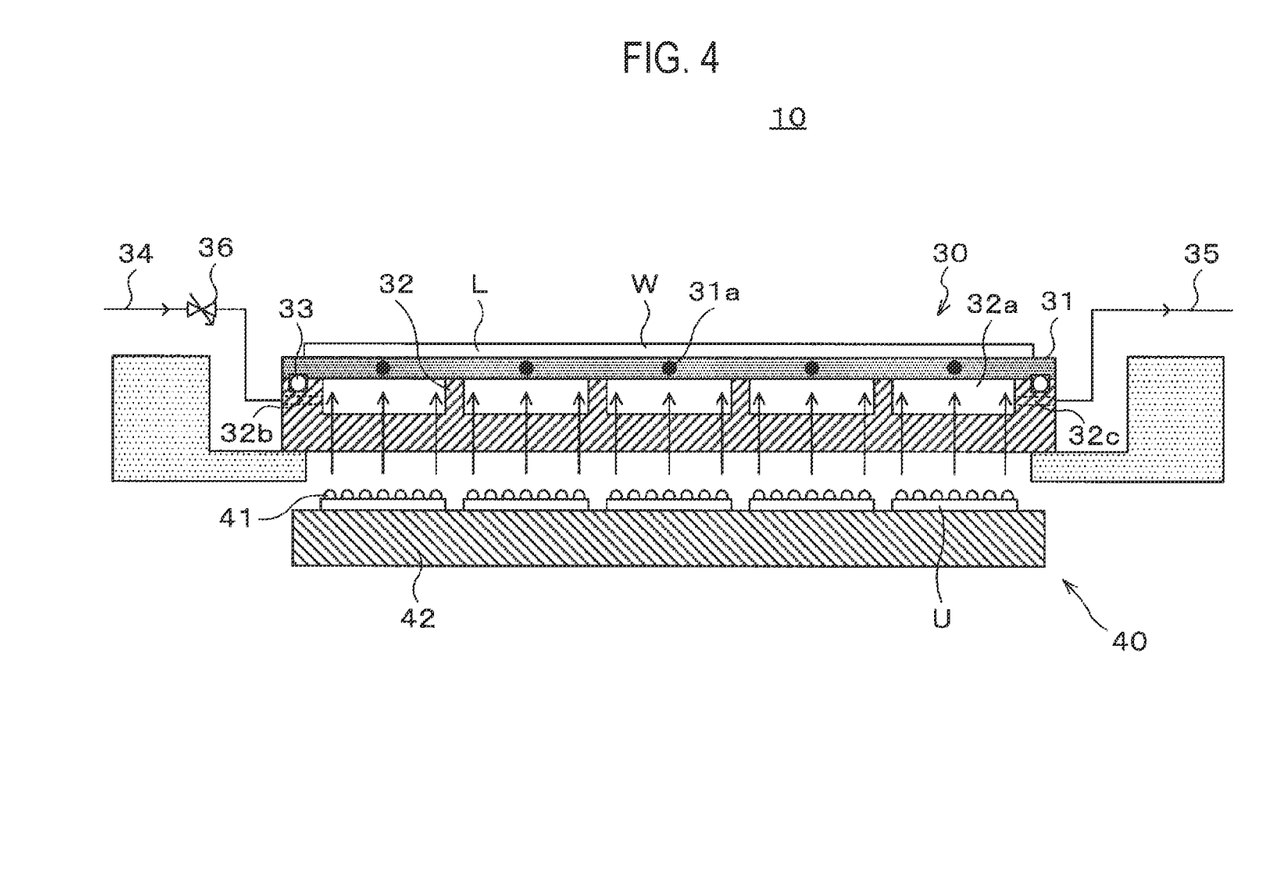
FIG. 4 is a cross-sectional view schematically illustrating the configuration of a stage.
Figure 5:
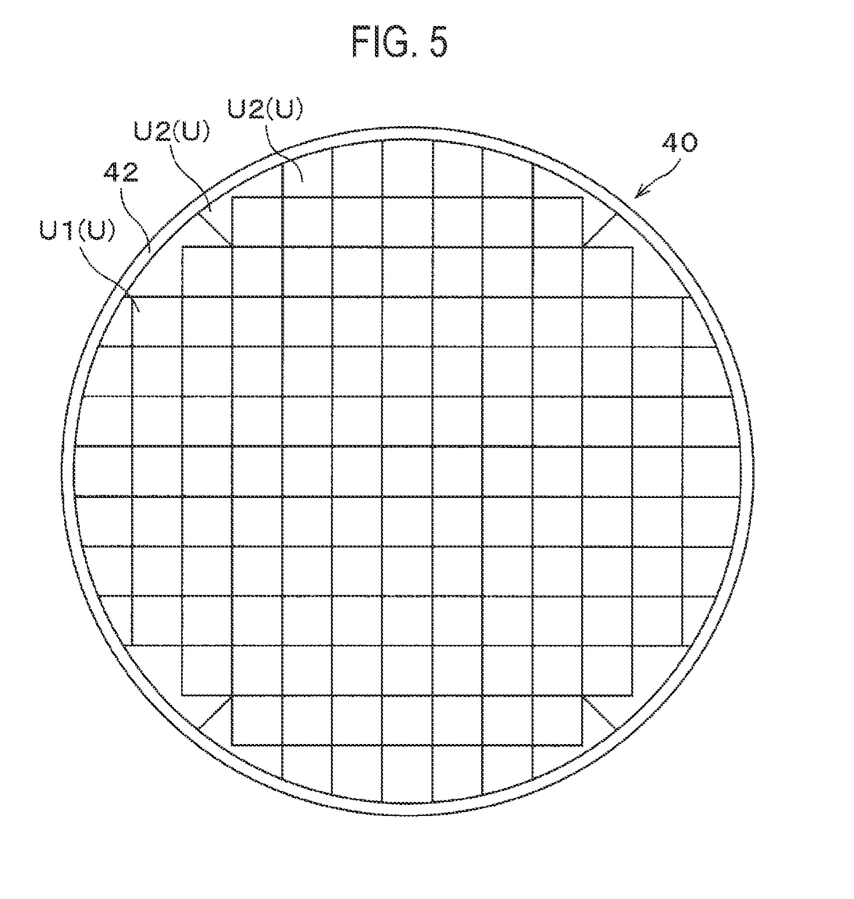
FIG. 5 is a plan view schematically illustrating a configuration of a light irradiation mechanism.

Next, the configuration of the stage 10 will be described with reference to FIGS. 4 and 5. FIG. 4 is a cross-sectional view schematically illustrating an upper configuration of the stage 10, and FIG. 5 is a plan view schematically illustrating a configuration of the light irradiation mechanism 40 to be described later.

As illustrated in FIG. 4, the stage 10 has the placement table 30 and the light irradiation mechanism 40 in the order from the upper portion of the stage 10. The placement table 30 is a table on which the substrate W is placed. The light irradiation mechanism 40 irradiates a lid member 31 (to be described later) of the placement table 30 with light, thereby heating the substrate W and thus heating the electronic devices D formed on the substrate W.

The placement table 30 has the lid member 31 provided on a placement side on which the substrate W is placed, that is, an upper side of the placement table 30, and a bottomed member 32 on a side of the placement table opposite to the substrate placement side of the placement table, that is, a lower side of the placement table 30. The lid member 31 and the bottomed member 32 are in contact with each other via an O-ring 33.

The lid member 31 is formed in a disc shape and is made of, for example, SiC. SiC has high thermal conductivity and Young's modulus and also has high absorption efficiency for light from the light irradiation mechanism 40. Therefore, by forming the lid member 31 with SiC, it is possible to efficiently heat/cool the substrate W placed on the lid member 31 when the lid member 31 is heated/cooled. In addition, by forming the lid member 31 with SiC, it is possible to prevent the lid member 31 from being cracked. Further, it is possible to efficiently heat the lid member 31, that is, the substrate W, with the light from the light irradiation mechanism 40. Moreover, since a green sheet method or the like can be used for SiC, the workability is high and the manufacturing cost of the inspection apparatus 1 can be reduced.

Suction holes (not shown) by which the substrate W is vacuum-suctioned are formed on the upper surface of the lid member 31. Further, a plurality of temperature sensors 31a is embedded in the lid member 31 at positions spaced apart from each other in a plan view.

The bottomed member 32 is formed in a disk shape having substantially the same diameter as the lid member 31 and is formed of a light-transmissive member that transmits the light from the light irradiation mechanism 40. When the light from the light irradiation mechanism 40 is near-infrared light, polycarbonate, quartz, polyvinyl chloride, acrylic resin, or glass may be used as the light-transmissive member. Further, since it is easy to process and mold these materials, the manufacturing cost of the inspection apparatus 1 can be reduced.

Further, a groove for flowing refrigerant into the placement table 30 is formed on the upper surface of the bottomed member 32. The groove is covered with the lid member 31 to form a refrigerant flow path 32a. In other words, the placement table 30 has the refrigerant flow path 32a formed therein by the lid member 31 and the bottomed member 32. In the inspection apparatus 1, by cooling down the substrate W placed on the placement table 30 with the refrigerant flowing through the refrigerant flow path 32a, the electronic devices formed on the substrate W are cooled down, i.e., the heat of the electronic devices is adsorbed.

Further, a supply port 32b and a discharge port 32c, which communicate with the refrigerant flow path 32a, are formed on the side of the bottomed member 32. The supply port 32b is connected to a refrigerant pipe 34 for supplying the refrigerant to the refrigerant flow path 32a, and the discharge port 32c is connected to a discharge pipe 35 for discharging the refrigerant from the refrigerant flow path 32a. A flow rate control valve 36 that controls a flow rate of the refrigerant to be supplied to the refrigerant flow path 32a is provided in the refrigerant pipe 34. A three-way valve may be provided as the flow rate control valve 36, and a bypass flow path that bypasses the refrigerant flow path 32a may also be provided. Further, in case where the valves of the refrigerant flow path 32a and the bypass flow path are variable conductance valves, assuming that the conductance of the refrigerant flow path 32a is Cv and the conductance of the bypass flow path is Cvb, by setting Cv+Cvb=constant, control can be performed without changing the total conductance.

For example, water, which is a light-permeable liquid, is used as the refrigerant flowing through the refrigerant flow path 32a, and is supplied to the refrigerant flow path 32a via the refrigerant pipe 34 by a pump (not shown) provided outside the inspection apparatus 1. The operation of the flow rate control valve 36 and the like for adjusting the flow rate of the refrigerant is controlled by the controller 13. In a temperature range where water freezes or a temperature range where water boils, a fluorocarbon refrigerant may be used as the refrigerant.

The light irradiation mechanism 40 is disposed so as to face the surface of the placement table 30 opposite to the placement side of the substrate W, namely so as to face the lower surface of the bottomed member 32.

The light irradiation mechanism 40 has a plurality of LEDs 41 provided to be oriented to the substrate W. Specifically, the light irradiation mechanism 40 has a plurality of LED units U in Which the plurality of LEDs 41 is unitized, and has a base 42 having a surface on Which the LED units U are mounted.

For example, as illustrated in FIG. 5, the LED units U of the light irradiation mechanism 40 have units U1 each having a square shape in a plan view, which are arranged in the same number as the electronic devices D (see FIG. 3) formed on the substrate W, and units U2 each having a non-rectangular shape in a plan view, which cover outer peripheries of the units U1. Further, the LED units U cover substantially the entire surface of the base 42 with the units U1 and U2 described above. Accordingly, at least the entire portion of the lid member 31 on which the substrate W is placed can be irradiated with light from the LEDs 41 of the LED units U.

Each LED 41 irradiates the substrate W with light. In this example, each LED 41 emits near-infrared light. The light emitted from the LED 41 (hereinafter also referred to as "LED light") passes through the bottomed member 32 of the placement table 30, which is formed of a light-transmissive member. The light that has passed through the bottomed member 32 passes through the refrigerant that flows through the refrigerant flow path 32a of the placement table 30 and is capable of transmitting the light, and then is incident on the lid member 31.

In the light irradiation mechanism 40, the LED light incident on the lid member 31 on which the substrate W is placed in the placement table 30 is controlled on the basis of LED unit U. Therefore, the light irradiation mechanism 40 may irradiate only an arbitrary portion of the lid member 31 with the LED light, or may make the intensity of the irradiated light different between the arbitrary portion and the other portions.

The inspection apparatus 1 controls such that the temperature of the electronic device D as inspection objects formed on the substrate W on the placement table 30 becomes constant at a target temperature by the heating by the light from the light irradiation mechanism 40 and the heat absorption by the refrigerant flowing through the refrigerant flow path 32a. For this temperature control, the inspection apparatus 1 measures the temperature of the electronic device D.

Figure 6:
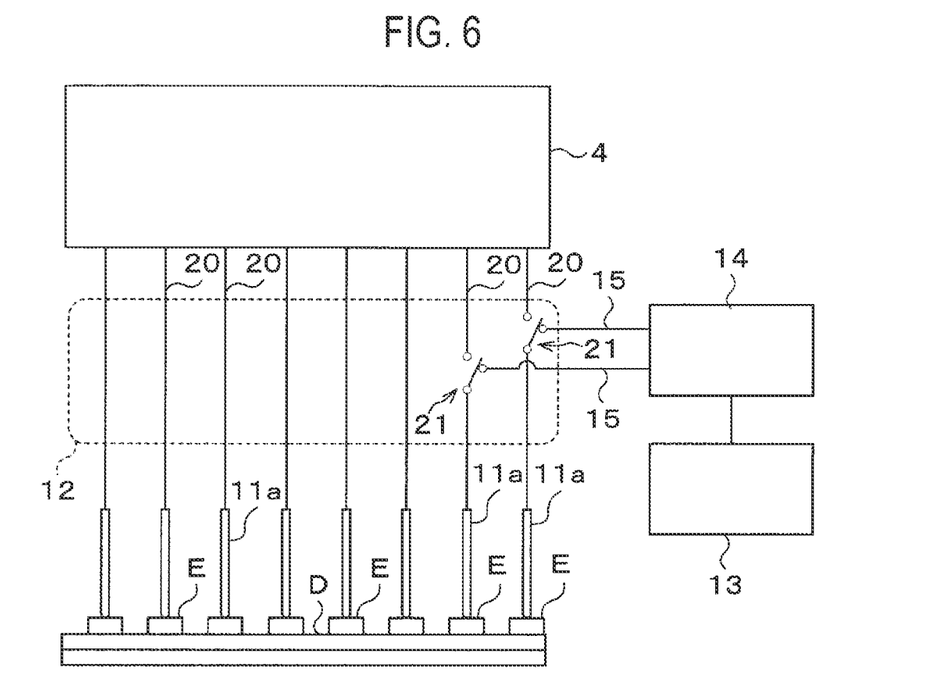
FIG. 6 is a view schematically illustrating a configuration of a circuit that measures a temperature of the substrate in the inspection apparatus of FIG. 1.

FIG. 6 is a view schematically illustrating a configuration of a temperature measurement circuit of the electronic device D in the inspection apparatus 1.

In the inspection apparatus 1, as illustrated in FIG. 6, each probe 11a is connected to the tester 4 by a plurality of wirings 20 arranged on the interface 12. In addition, a relay 21 is provided on each of two wirings 20 that connect two probes 11a, which are in contact with two electrodes F of the potential difference generation circuit (for example, a diode) in the electronic device D, and the tester 4, among the wirings 20.

Each relay 21 is configured to be able to switch and transmit the potential of each electrode E to either the tester 4 or the potential difference measurement unit 14. For example, each relay 21 transmits the potential of each electrode E to the potential difference measurement unit 14 at a predetermined timing after a mounting voltage is applied to each electrode E when inspecting the electrical characteristics of the electronic device D. It is known that in the above potential difference generation circuit, a potential difference generated when a predetermined current flows is different depending on the temperature. Therefore, the temperature of the electronic device D can be measured in real time during the inspection based on the potential difference of the potential difference generation circuit in the electronic device D, that is, the potential difference between the two electrodes F (probes 11a) of the potential difference generation circuit. In the inspection apparatus 1, the potential difference measurement unit 14 acquires the potential difference of the potential difference generation circuit in the electronic device D based on the potential of each electrode E transmitted from each relay 21, and further transmits the acquired potential difference to the controller 13. The controller 13 measures the temperature of the electronic device D based on the transmitted potential difference and the temperature characteristic of the potential difference of the potential difference generation circuit.

The method of measuring the temperature of the electronic device D is not limited to the above, but any other methods may be used as long as the temperature of the electronic device D can be measured.

Figure 7:
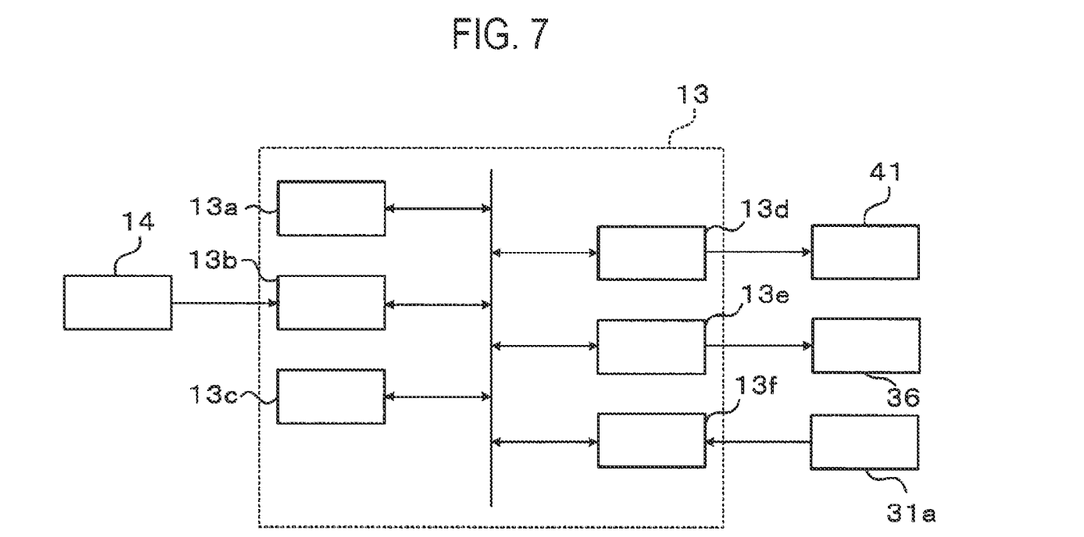
FIG. 7 is a block diagram schematically illustrating a configuration of a controller.

Next, a configuration related to the temperature control of the electronic device D of the controller 13 will be described with reference to FIG. 7. FIG. 7 is a block diagram schematically illustrating an outline of the configuration of the controller 13.

The controller 13 is composed of, for example, a computer, and has a program storage part (not shown). The program storage part stores programs and the like for controlling various processes such as the temperature control process and the like of the electronic device D in the inspection apparatus 1. The programs may be recorded in, for example, a computer-readable storage medium, and may be installed on the controller 13 from the storage medium.

The controller 13 includes a storage part 13a, a temperature information acquisition part 13b, a temperature calculation part 13c, a heating controller 13d, a heat absorption controller 13e, and another temperature information acquisition part 13f.

The storage part 13a stores the target temperature of the electronic device D, the temperature of the refrigerant, the maximum light output of the LED 41, and the like. The temperature of the refrigerant is determined in advance from, for example, the target temperature of the electronic device D, the maximum output of the LED 41, and the like. The storage part 13a also stores information on the temperature characteristics of the potential difference of the potential difference generation circuit in the electronic device D. Further, the storage part 13a stores calculation results of the temperature calculation part 13c and the like.

The temperature information acquisition part 13b acquires, from the potential difference measurement part 14, the information on the potential difference of the above-mentioned potential difference generation circuit in the electronic device D as information on the temperature of the electronic device D as an inspection object at each time point during the inspection and until the end of the inspection.

The temperature calculation part 13c calculates the temperature of the electronic device D based on the information on the potential difference of the potential difference generation circuit of the electronic device D as an inspection object, which is acquired by the temperature information acquisition part 13b at each time point during the inspection and until the end of the inspection, and the information on the temperature characteristic of the potential difference of the potential difference generation circuit. The temperature of the electronic device D calculated at each time point until the end of the inspection is stored in the storage part 13a for each inspection. That is, the transition of the temperature of the electronic device D is stored in the storage part 13a for each inspection.

The heating controller 13d controls the light output from the LED 41 to control the heating of the electronic device D by the light from the LED 41. In particular, the heating controller 13d controls the light output from the LED 41 at the time of inspection by a closed loop control (for example, PID control) based on the temperature of the electronic device D as a current inspection object. Specifically, the heating controller 13d determines the operation amount of the LED 41 at each point until the end of the inspection so that the temperature of the electronic device D as a current inspection object becomes constant at the target temperature. More specifically, the heating controller 13d calculates, for example, a deviation between the temperature of the electronic device D as an inspection object, which is calculated by the temperature calculation part 13c, and the target temperature of the electronic device D, which is stored in the storage part 13a. Then, the heating controller 13d calculates/determines the operation amount of the LED 41 corresponding to the electronic device D as an inspection object from the deviation by the PID operation. Based on the calculated/determined operation amount, the heating controller 13d adjusts the light output of the corresponding LED 41. As a result, the heating of the electronic device D as an inspection object by the light from the LED 41 is controlled. In addition, the operation amount of the LED 41 calculated/determined at each time from the start of the inspection to the end of the inspection is converted into, for example, a heating amount ($Q_L$) by the light output from the LED 41 and stored in the storage part 13a for each inspection. That is, a transition of the heating amount ($Q_L$) by the light output from the LED 41 is stored in the storage part 13*a* for each inspection.

The heat absorption controller 13*e* controls the flow rate of the refrigerant flowing through the refrigerant flow path 32*a* of the placement table 30. Based on a transition (profile) of a temperature ($T_D$) of the electronic device D in the inspection up to the n-th time, the heat absorption controller 13*e* estimates a transition of power ($P_{E,n+1}$) applied from the tester 4 to the electronic device D at an (n+1)-th inspection. That is, based on the transition of the temperature ($T_D$) of the electronic device D in the past inspection, the heat absorption controller 13*e* estimates a transition of power ($P_E$) applied from the tester 4 to the electronic device D at the next inspection.

The reason for estimating the transition of power ($P_E$) applied from the tester 4 to the electronic device D at the next inspection in this way is as follows. That is, the inspection includes a plurality of tests, powers applied to the electronic device D are different for each test, and the order of the tests may be changed by an operator of the inspection apparatus 1. This is because information on the test order and type is not transmitted to the controller 13. If the information on the test order and type is transmitted from the tester 4 to the controller 13, the inspection apparatus 1 can discriminate the test order and type to make a determination on the power transition without estimating.

The heat absorption controller 13*e* controls the flow rate of the refrigerant flowing through the refrigerant flow path 32*a* of the placement table 30 at the time of the (n+1)-th inspection by an open loop control based on the estimated (n+1)-th transition of power ($P_{E,n+1}$). Specifically, the opening degree of the flow rate control valve 36 at each time until the end of the inspection in the inspection up to the (n+1)-th time is calculated/determined based on the estimated (n+1)-th transition of power ($P_{E,n+1}$). Then, the heat absorption controller 13*e* adjusts the flow rate of the refrigerant flowing through the refrigerant flow path 32*a* of the placement table 30 based on the calculated/determined opening degree of the flow rate control valve 36. As a result, the heat absorption of the electronic device D as an inspection object by the refrigerant is controlled.

The following effects are obtained by controlling the heat absorption as described above.

A range in which the temperature of the electronic device D can be adjusted to the target temperature by heating with the LED 41 is determined by the maximum output of the LED 41 and the density of the LED 41, but there are cases where the LED 41 having a small maximum output or a low density is used. Even in this case, as described above, by controlling the heat absorption based on the transition of power ($P_E$) at the time of the next inspection estimated from the past inspection, the temperature of the electronic device D can be adjusted to the target temperature by heating with the LED 41.

The opening degree of the flow rate control valve 36 calculated/determined as described above at each time point until the end of the inspection is converted into, for example, the heat absorption amount ($Q_R$) by the refrigerant and stored in the storage part 13*a* for each inspection. That is, the transition of the heat absorption amount ($Q_R$) by the refrigerant is stored in the storage part 13*a* for each inspection.

Another temperature information acquisition part 13*f* of the controller 13 acquires information on the temperature of the placement table 30, specifically, information on the temperature of the lid member 31, from the temperature sensor 31*a*.

Here, the estimation of the transition of power ($P_{E,n+1}$) applied from the tester 4 to the electronic device D at the (n+1)-th inspection performed by the heat absorption controller 13*e* will be further described.

The power ($P_{E,n}$) applied from the tester 4 to the electronic device D at each time point of the n-th inspection, which is the past inspection, is proportional to the heat quantity ($Q_{E,n}$) radiated to the electronic device D by the power ($P_{E,n}$) at each time point of the n-th inspection. Then, the heat quantity ($Q_{\Delta T,n}$) that causes a temperature change $\Delta T$ in the electronic device D at each time point of the n-th inspection can be expressed by the following equation (1).

$$Q_{\Delta T,n} = Q_{L,n} - Q_{R,n} + Q_{E,n} \tag{1}$$

In the equation (1), $Q_{L,n}$ represents the heating amount of the electronic device D as an inspection object by the light output from the LED 41 at each time point of the n-th inspection. Similarly, $Q_{R,n}$ represents the heat absorption amount from the electronic device D as an inspection object by the refrigerant at each time point of the n-th inspection, and $Q_{E,n}$ represents the heat quantity radiated to the electronic device D by the power from the tester 4 at each time point of the n-th inspection.

By transforming the above equation (1), the heat quantity ($Q_{E,n}$) radiated to the electronic device D by the power from the tester 4 at each time point of the n-th inspection can be expressed by the following equation (2).

$$Q_{E,n} = Q_{\Delta T,n} - Q_{L,n} + Q_{R,n} \tag{2}$$

Further, as described above, the temperature of the electronic device D at each time point is stored in the storage part 13*a* for each inspection. The heat quantity ($Q_{\Delta T}$) that causes the temperature change ($\Delta T$) in the electronic device D at each time point can be calculated from the temperature of the electronic device D at each time point. Furthermore, as described above, the heating amount ($Q_L$) by the LED 41 at each time point and the heat absorption amount ($Q_R$) by the refrigerant at each time point are stored in the storage part 13*a*.

Therefore, from the equation (2) and the information about the n-th inspection stored in the storage part 13*a*, the heat absorption controller 13*e* calculates the heat quantity ($Q_{E,n}$) radiated to the electronic device D by the power from the tester 4 at each time point of the n-th inspection.

Here, the power ($P_E$) from the tester 4 to the electronic device D is proportional to the heat quantity ($Q_E$) radiated to the electronic device D by the power ($P_E$). Therefore, the calculation of the heat quantity ($Q_{E,n}$) by the power from the tester 4 at each time point of the n-th inspection means that the power ($P_{E,n}$) applied from the tester 4 to the electronic device D can be calculated at each time point of the n-th inspection. The power to the electronic device D calculated at each time point until the end of the inspection is stored in the storage part 13*a* for each inspection.

Then, based on the power from the tester 4 to the electronic device D in the inspection up to the n-th time at each time point until the end of the inspection, the heat absorption controller 13*e* estimates the power ($P_{E,n+1}$) from the tester 4 to the electronic device D in the (n+1)-th inspection. That is, the transition of the power in the (n+1)-th inspection is estimated. For example, the successive least squares method or the like is used for the estimation.

When using the successive least squares method, it is preferable to use one with a forgetting factor. This is because weighting can be increased for the calculation result of the power to the electronic device D in the new inspection and weighting can be decreased for the calculation result in the old inspection, so that more accurate estimation can be performed.

In addition, when using the successive least squares method, the average value of the power from the tester 4 to the electronic device D in the inspection from a first inspection to a predetermined number of times of inspection may be calculated at each time point until the end of the inspection. Then, for the m-th (m>predetermined number of times) inspection, the power ($P_{E,m}$) from the tester 4 to the electronic device D in the inspection is estimated by the successive least squares method using the average value as an initial value. In this case, in the inspection from the first time to the predetermined number of times, the heat absorption controller 13e controls, for example, the flow rate of the refrigerant flowing through the refrigerant flow path 32a of the placement table 30 to a predetermined flow rate. The predetermined number of times is, for example, the number of times the inspection of all the electronic devices D provided on the first substrate W is completed, or the number of times the inspection of all the substrates W of one lot is completed.

In addition, in the inspection performed by the inspection apparatus 1, the inspection may be terminated halfway before all the tests included in the inspection are completed. For example, when the temperature of the electronic device D as an inspection object is abnormal in the test before the last test included in the inspection, the inspection is ended halfway. When estimating the transition of power ($P_E$) from the tester 4 to the electronic device D in the next inspection, it is preferable to exclude, from the past inspections to be referred to, the inspection that was completed halfway as described above. Determination on whether or not the inspection is completed halfway can be made based on whether or not the controller 13 acquires an inspection start signal and an inspection end signal from the tester 4 and an interval from reception of the inspection start signal to reception of the inspection end signal is shorter than a predetermined time. It is also possible to determine the inspection to be excluded by comparing the acquired temperature profile of the electronic device D, that is, the temperature transition, with the temperature profile of the electronic device D which is estimated to be normal.

Next, an example of an inspection process for the substrate W using the inspection apparatus 1 will be described.

First, the substrate W is taken out from the FOUP of the loader 3 and is transferred to and placed on the stage 10. Next, the stage 10 is moved to a predetermined position.

Then, all the LEDs 41 of the light irradiation mechanism 40 are turned on. Based on information acquired from the temperature sensor 31a of the lid member 31, the light output from the LED 41 and the flow rate of the refrigerant flowing through the placement table 30 are adjusted so that the temperature of the lid member 31 becomes uniform in the plane.

In this state, the potential difference measurement unit 14 acquires the potential difference of the above-mentioned potential difference generation circuit in the electronic device D as an inspection object. Then, assuming that the temperature of the lid member 31, which is made uniform in the plane, substantially matches the temperature of the electronic device D as an inspection object, the potential difference is calibrated, i.e., information on the temperature characteristics of the potential difference is corrected. The steps up to the correction are performed for each substrate W, for example.

After that, the stage 10 is moved, and the probe 11a installed above the stage 10 comes into contact with the electrode E of the electronic device D as an inspection object on the substrate W.

Then, a signal for inspection is input to the probe 11a. As a result, the inspection of the electronic device D is started. During this inspection, the temperature of the electronic device D as an inspection object is calculated from the information on the potential difference generated in the potential difference generation circuit of the electronic device D. Then, the heating controller 13d controls the light output from the LED 41 of the LED unit U corresponding to the electronic device D by the closed loop control based on the temperature. Further, during the above inspection, the heat absorption controller 13e controls the flow rate of the refrigerant flowing through the refrigerant flow path 32a of the placement table 30 by the method described above.

After that, the steps after the calibration of the potential difference of the potential difference generation circuit in the electronic device D are repeated until the inspection of all the electronic devices D provided on the substrate W is completed. In addition, the transition of the temperature of the electronic device D as an inspection object, the transition of the heating amount by the light output from the LED 41, and the transition of the heat absorption amount of the refrigerant are stored in the storage part 13a for each inspection.

When the inspection of all the electronic devices D is completed, the substrate W is returned to the FOUP of the loader 3, a subsequent substrate W is transferred to the stage 10. Thereafter, the above-described steps are executed until the inspection of all the substrates W is completed.

As described above, according to the present embodiment, the inspection apparatus 1 that inspects the electronic device D includes the placement table 30 on which the substrate W on which the electronic device D is provided is mounted, the placement table 30 being formed of the light-transmissive member on the side of the placement table opposite to the substrate placement side of the placement table and having therein the refrigerant flow path 32a through which the refrigerant capable of transmitting light flows, the light irradiation mechanism 40 that is disposed so as to face the surface of the side of the placement table 30 opposite to the substrate placement side of the placement table and has the plurality of LEDs 41 directed to the substrate W, and the controller 13 that controls the heat absorption by the refrigerant flowing through the refrigerant flow path 32a and the heating by the light from the LEDs 41 to control the temperature of the electronic device D as an inspection object, wherein the controller 13 includes the temperature information acquisition part 13b that acquires the information on the temperature of the electronic device D as an inspection object, the heating controller 13d that performs the control of the heating of the electronic device D as an inspection object by the light from the LEDs 41 by the closed loop control based on the temperature of the electronic device D as a current inspection object, and the heat absorption controller 13e that estimates the transition of the power applied to the electronic device D at the next inspection based on the transition of the temperature of the electronic device D in the past inspection and performs the control of the heat absorption from the electronic device D as an inspection object by the refrigerant at the time of the next inspection by the open loop control based on the estimated transition of the power.

Since the inspection apparatus 1 has the placement table 30 and the light irradiation mechanism 40 as described above, it is possible to cause the LED light from each LED 41 to reach the lid member 31 of the placement table 30 through the refrigerant or the like. Further, the light irradiation mechanism 40 can locally irradiate the lid member 31 with the LED light by the LED 41. If there is a configuration for controlling the heat absorption by the refrigerant, it may be conceivable to control the temperature of the electronic device D only by controlling the heat absorption by the refrigerant without depending on the control of the LED light. On the other hand, in the present embodiment, not only the heat absorption by the refrigerant but also the control by the LED light is performed to control the temperature of the electronic device D. Therefore, it is possible to cool other electronic devices D on the substrate W while controlling the temperature of only the electronic device D as an inspection object. Therefore, it is possible to prevent the thermal load from the electronic device D as an inspection object from being applied to other electronic devices D. As a result, it is possible to apply a desired mounting voltage to the electronic device D, and thus it is possible to detect a defect that occurs at the time of applying the mounting voltage before packaging, thereby suppressing a decrease in yield after packaging, and preventing an increase in cost.

Further, since the temperature of the electronic device D as an inspection object is controlled as described above, it is not necessary to use the LED 41 having a large maximum output or increase the density of the LED 41. The LED 41 having a large maximum output is expensive, and the cost increases if the density of the LED 41 is increased. Further, when using the LED 41 having a large maximum output or increasing the density of the LED 41, it is necessary to cool the LED 41 itself. Therefore, in the present embodiment, it is possible to prevent an increase in cost, and it is also possible to eliminate a need for cooling the LED 41. Furthermore, since the failure rate of the LED 41 when the LED 41 is not cooled is low, the reliability of the inspection apparatus 1 can be maintained.

In addition, the light irradiation mechanism 40 can locally change the intensity of light with which the lid member 31 is irradiated by each LED unit U. Therefore, it is possible to locally change the irradiation state of the lid member 31 with the LED light while cooling the lid member 31 entirely by the refrigerant in the placement table 30, and thus to set the heating state of the electronic device D as an inspection object to be different from other electronic devices. That is, it is possible to inspect the electronic device D as an inspection object while controlling both the temperature of the electronic device D as an inspection object and the temperature of the other electronic devices D on the substrate W.

Further, in the present embodiment, the heat absorption controller 13e controls the opening degree of the flow rate control valve 36 provided in the refrigerant pipe 34 that communicates with the refrigerant flow path 32a to adjust the flow rate of the refrigerant flowing through the refrigerant flow path 32a, and controls the heat absorption from the electronic device D as an inspection object by the refrigerant. Therefore, the responsiveness is higher than in a case where the heat absorption is controlled by adjusting the temperature of the refrigerant.

Further, in the present embodiment, the heat absorption controller 13e uses the successive least squares method to estimate the transition of the power applied to the electronic device D at the next inspection based on the transition of the temperature of the electronic device D in the past inspection. Therefore, the transition of the power can be accurately estimated. Further, since the heat absorption amount can be adjusted in advance based on the estimated value of the power applied to the electronic device D, the temperature control in a region where the controllability of the LED 41 is good becomes possible.

In the present embodiment, water is used as the refrigerant that is required to absorb heat. Therefore, the heat absorption by the refrigerant can be carried out at a higher speed than in a case where a fluorocarbon refrigerant is used. The fluorocarbon refrigerant can also be used to control the temperature in a wider range.

Further, in the present embodiment, since water is used as the refrigerant for absorbing heat and SiC is used for the lid member 31 of the placement table 30, the temperature response characteristic is high.

Further, in the present embodiment, when inspecting the electronic device D, it is not necessary to cut out the electronic device D into chips, and the inspection can be performed on the basis of wafer.

It should be noted that the embodiments disclosed herein are exemplary in all respects and are not restrictive. The above-described embodiments may be omitted, replaced or modified in various forms without departing from the scope and spirit of the appended claims.

EXPLANATION OF REFERENCE NUMERALS

1: inspection apparatus, 13: controller, 13b: temperature information acquisition part, 13c: temperature calculation part, 13d: heating controller, 13e: heat absorption controller, 30: placement table, 32a: refrigerant flow path, 40: light irradiation mechanism, 41: LED, W: substrate

What is claimed is:

1. An inspection apparatus that inspects an electronic device, comprising:
a placement table on which a substrate having the electronic device provided thereon is placed, wherein a side of the placement table opposite to a substrate placement side of the placement table is formed of a light-transmissive member, and the placement table has a refrigerant flow path provided therein and through which a refrigerant capable of transmitting light flows;
a light irradiation mechanism disposed so as to face a surface of the side of the placement table opposite to the substrate placement side of the placement table and having a plurality of LEDs directed to the substrate; and
a controller configured to control heat absorption by the refrigerant flowing through the refrigerant flow path and heating by the light from the plurality of LEDs so as to control a temperature of the electronic device as an inspection object,
wherein the controller includes:
a to information acquisition part configured to acquire information on the temperature of the electronic device as the inspection object;
a heating controller configured to perform the control of the heating of the electronic device as the inspection object by the light from the plurality of LEDs by a closed loop control based on the temperature of the electronic device as a current inspection object; and
a heat absorption controller configured to estimate a transition of power applied to the electronic device at a next inspection based on a transition of the temperature of the electronic device in a past inspection, and perform the control of the heat absorption from the electronic device as the inspection object by the refrigerant at a time of the next inspection by an open loop control based on the estimated transition of the power.

2. The inspection apparatus of claim 1, wherein the heat absorption controller is configured to control an opening degree of a flow rate control valve provided in a refrigerant pipe that communicates with the refrigerant flow path to adjust a flow rate of the refrigerant flowing through the refrigerant flow path, and control the heat absorption.

3. The inspection apparatus of claim 2, wherein the heat absorption controller is configured to use a successive least squares method to estimate the transition of the power based on the transition of the temperature of the electronic device in the past inspection.

4. The inspection apparatus of claim 1, wherein the heat absorption controller is configured to use a successive least squares method to estimate the transition of the power based on the transition of the temperature of the electronic device in the past inspection.

5. A temperature control method in an inspection apparatus that inspects an electronic device, the inspection apparatus including:
   a placement table on which a substrate having the electronic device provided thereon is placed, wherein a side of the placement table opposite to a substrate placement side of the placement table is formed of a light-transmissive member, and the placement table has a refrigerant flow path provided therein and through which a refrigerant capable of transmitting light flows; and
   a light irradiation mechanism disposed so as to face a surface of the side of the placement table opposite to the substrate placement side of the placement table and having a plurality of LEDs directed to the substrate,
the temperature control method comprising:
performing a control of heating of the electronic device as an inspection object by the light from the plurality of LEDs by a closed loop control based on a temperature of the electronic device as a current inspection object; and
estimating a transition of power applied to the electronic device at a next inspection based on a transition of the temperature of the electronic device in a past inspection, and performing a control of heat absorption from the electronic device as the inspection object by the refrigerant at a time of the next inspection by an open loop control based on the estimated transition of the power.

* * * * *

UNITED STATES PATENT AND TRADEMARK OFFICE
CERTIFICATE OF CORRECTION

PATENT NO. : 11,385,280 B2
APPLICATION NO. : 17/056524
DATED : July 12, 2022
INVENTOR(S) : Shigeru Kasai and Yoshinori Fujisawa It is certified that error appears in the above-identified patent and that said Letters Patent is hereby corrected as shown below:

In the Claims

Claim 1, Column 14, Line 54, please delete the phrase "a to information acquisition" and replace with "a temperature information acquisition".

Signed and Sealed this
Twentieth Day of December, 2022

Katherine Kelly Vidal
*Director of the United States Patent and Trademark Office*